(12) United States Patent
Kojima et al.

(10) Patent No.: US 8,129,271 B2
(45) Date of Patent: Mar. 6, 2012

(54) FILM FORMING METHOD, FILM FORMING APPARATUS AND STORAGE MEDIUM

(75) Inventors: Yasuhiko Kojima, Nirasaki (JP); Taro Ikeda, Nirasaki (JP); Tatsuo Hatano, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 570 days.

(21) Appl. No.: 12/374,216

(22) PCT Filed: Jul. 17, 2007

(86) PCT No.: PCT/JP2007/064092
§ 371 (c)(1),
(2), (4) Date: Jan. 16, 2009

(87) PCT Pub. No.: WO2008/010489
PCT Pub. Date: Jan. 24, 2008

(65) Prior Publication Data
US 2009/0181538 A1    Jul. 16, 2009

(30) Foreign Application Priority Data

Jul. 20, 2006    (JP) ................................. 2006-197667

(51) Int. Cl.
*H01L 21/44*    (2006.01)
*C23C 16/00*    (2006.01)

(52) U.S. Cl. ... 438/654; 427/250; 427/252; 427/255.11; 427/255.39

(58) Field of Classification Search ............. 427/255.11, 427/255.39, 252, 250; 438/654
See application file for complete search history.

(56) References Cited

U.S. PATENT DOCUMENTS

| | | |
|---|---|---|
| 5,744,192 A | 4/1998 | Nguyen et al. |
| 6,110,530 A | 8/2000 | Chen et al. |
| 6,576,293 B2 * | 6/2003 | Zhuang et al. ............. 427/252 |
| 6,579,793 B2 | 6/2003 | Zhuang et al. |
| 6,726,954 B2 | 4/2004 | Zhang et al. |

(Continued)

FOREIGN PATENT DOCUMENTS
JP    10 140352    5/1998
(Continued)

OTHER PUBLICATIONS

Awaya, Nobuyoshi et al., "Accelerated-Deposition Rate and High-Quality Film Copper Chemical Vapor Deposition Using a Water Vapor Addition to a Hydrogen and Cu(HFA)$_2$ Reaction System", Jpn. J. Appl. Phys., vol. 32, No. 9A, pp. 3915-3919, (1993).

*Primary Examiner* — Ha Tran T Nguyen
*Assistant Examiner* — Aaron Dehne
(74) *Attorney, Agent, or Firm* — Oblon, Spivak, McClelland, Maier & Neustadt, L.L.P.

(57) ABSTRACT

A film forming method is provided with a substrate placing step wherein a substrate is placed in a process chamber in an airtight status; a first film forming step wherein the process chamber is supplied with water vapor and a material gas including an organic compound of copper, and an adhered layer of copper is formed on the substrate; an exhaust step wherein the water vapor and the material gas in the process chamber are exhausted; and a second film forming step wherein the process chamber is resupplied with only the material gas and a copper film is further formed on the adhered layer.

6 Claims, 8 Drawing Sheets

U.S. PATENT DOCUMENTS

| | | | |
|---|---|---|---|
| 2002/0052109 A1* | 5/2002 | Zhang et al. | 438/687 |
| 2004/0009665 A1* | 1/2004 | Chen et al. | 438/687 |
| 2004/0171251 A1* | 9/2004 | Nguyen | 438/687 |
| 2005/0092250 A1* | 5/2005 | Kojima et al. | 118/715 |

FOREIGN PATENT DOCUMENTS

| | | |
|---|---|---|
| JP | 2001 26872 | 1/2001 |
| JP | 2002 60942 | 2/2002 |
| JP | 2002 356775 | 12/2002 |

* cited by examiner

FILM FORMING METHOD, FILM FORMING APPARATUS AND STORAGE MEDIUM

FIELD OF THE INVENTION

The present invention relates to a technology for forming a copper film on a substrate such as a semiconductor wafer by using an organic compound of copper as a material.

BACKGROUND OF THE INVENTION

In a recent wiring technology, copper lines are replacing aluminum lines to improve performance of a semiconductor device. In a manufacturing process of the semiconductor device, a technology for forming a copper film on a surface of a semiconductor wafer (hereinafter, referred to as a "wafer") is important. A chemical vapor deposition method (hereinafter, referred to as "CVD") using a copper organic compound as a material has been known as one of technologies for forming a copper film on the wafer.

When a copper film is formed on the wafer by using CVD, a copper organic compound, e.g., Cu(hexafluoroacetylacetonate)trimethylvinylsilane (hereinafter, referred to as "Cu(hfac)TMVS") serving as a source gas is supplied to a processing chamber in a vacuum state, and the Cu(hfac)TMVS is thermally decomposed on the heated wafer to form the copper film on the wafer.

However, since copper atoms tend to be diffused into the insulating film, the copper film is mostly formed on a diffusion barrier film (hereinafter, referred to as a "base film") called a barrier metal, which is formed in advance on the substrate, instead of being directly formed on the wafer.

The base film employs titanium, tantalum, nitride thereof or the like. However, the barrier metal of the base film reacts with an organic material from the copper organic compound, thereby producing organic impurities at an interface between the copper film and the barrier metal.

In this case, adhesiveness between the base film and the copper film is weakened due to an organic impurity layer and a resistance between an upper copper line and a lower copper line increases. Accordingly, electrical characteristics deteriorate or the copper film is peeled off while processing the wafer, resulting in a reduction in production yield. Further, since the organic impurity layer has poorer wettability than the base film, copper can be easily aggregated to thereby reduce buriability of the copper in a trench having a high aspect ratio, thereby causing a formation defect of the copper line.

In order to solve the problem that the adhesiveness between the copper film and the base film is reduced due to formation of the organic impurity layer, Japanese Laid-open Application No. 2002-60942 (see, particularly, paragraphs [0037], [0038] and [0057]) discloses a technology using water vapor. In accordance with the technology disclosed in the above-mentioned document, water vapor is supplied in advance to the processing chamber containing the wafer, and both the water vapor and Cu(hfac)TMVS are supplied to the processing chamber for, e.g., 0.5 second. Then, only the supply of water vapor is stopped to prevent formation of the organic impurity layer, thereby obtaining the copper film having improved adhesiveness to the base film.

However, in the CVD using Cu(hfac)TMVS as a material, it is known that the water vapor causes a demerit of abnormal growth of the copper film in a needle shape though it prevents formation of the organic impurity layer. From this point, in the technology disclosed in the above-mentioned document, since the water vapor still remains in the processing chamber even though the supplies of these gases are stopped, it is difficult to immediately stop the abnormal growth of the copper film. In this case, since a gap develops between the base film and the copper film, it is difficult to improve adhesiveness.

SUMMARY OF THE INVENTION

The present invention is devised in view of the above-mentioned problems. An object of the present invention is to provide a film forming method and a film forming apparatus capable of obtaining a copper film having excellent adhesiveness to a base film by preventing the formation of an organic impurity layer and the abnormal growth of the copper film.

In accordance with a first aspect of the present invention, there is provided a film forming method comprising: a substrate placing step of placing a substrate in an airtightly sealed processing chamber; a first film forming step of forming an adhesion layer of copper on the substrate by supplying water vapor and a source gas containing an organic compound of copper to the processing chamber; a discharging step of discharging the water vapor and the source gas out of the processing chamber; and a second film forming step of forming a copper film on the adhesion layer by resupplying only the source gas to the processing chamber.

In accordance with the first aspect of the present invention, since the adhesion layer is formed under an atmosphere containing water vapor, although the base film on which the adhesion layer is formed is made of metal such as titanium having a high oxidation tendency, it is possible to prevent formation of the organic impurity layer and improve adhesiveness between the base film and the adhesion layer. Further, the processing chamber is evacuated after formation of the adhesion layer and, then, the Cu(hfac)TMVS gas is resupplied to form the copper film, thereby suppressing an abnormal growth of the copper film due to the water vapor.

In accordance with a second aspect of the present invention, there is provided a film forming method comprising: a substrate placing step of placing a substrate in an airtightly sealed processing chamber; a first film forming step of forming an adhesion layer of copper on the substrate by supplying water vapor and a source gas containing an organic compound of copper to the processing chamber; a discharging step of discharging the water vapor and the source gas out of the processing chamber; and a second film forming step of forming a copper film on the adhesion layer by resupplying the source gas and the water vapor to the processing chamber, wherein an amount of the water vapor supplied in the second film forming step is smaller than an amount of the water vapor supplied in the first film forming step.

In accordance with the second aspect of the present invention, since the adhesion layer is formed under an atmosphere containing water vapor, although the base film on which the adhesion layer is formed is made of metal such as titanium having a high oxidation tendency, it is possible to prevent formation of the organic impurity layer and improve adhesiveness between the base film and the adhesion layer. Further, the processing chamber is evacuated after formation of the adhesion layer and, then, the Cu(hfac)TMVS gas and a small amount of water vapor are resupplied to form the copper film, thereby suppressing an abnormal growth of the copper film due to the water vapor.

In the first film forming step, the supply of the source gas may start in a delayed manner after starting the supply of the water vapor. For example, in the first film forming step, the supply of the source gas may start after stopping the supply of the water vapor.

Further, in the first film forming step, the supply of the water vapor and the supply of the source gas may be simultaneously performed.

Further, preferably, the substrate is heated to a temperature within a range from 100° C. to 150° C.

Further, preferably, a base film made of metal selected from titanium and tantalum, a base film made of a compound obtained by combining the metal with one or two elements among nitrogen, carbon and oxygen, or a base film made of ruthenium or oxide thereof is formed in advance on the substrate, and the copper film is formed on the base film.

In accordance with a third aspect of the present invention, there is provided a film forming apparatus comprising: an airtightly sealed processing chamber including a stage for mounting a substrate thereon; a water vapor supply unit for supplying water vapor to the processing chamber; a source gas supply unit for supplying a source gas containing an organic compound of copper to the processing chamber; an exhaust unit for evacuating the processing chamber; a temperature control unit for maintaining a temperature of the substrate within a range from 100° C. to 150° C.; a controller for controlling the units to perform a step of forming an adhesion layer of copper on the substrate by supplying water vapor and a source gas containing an organic compound of copper to the processing chamber, a step of discharging the water vapor and the source gas out of the processing chamber, a step of forming a copper film on the adhesion layer by resupplying only the source gas to the processing chamber.

In accordance with a fourth aspect of the present invention, there is provided a film forming apparatus comprising: an airtightly sealed processing chamber including a stage for mounting a substrate thereon; a water vapor supply unit for supplying water vapor to the processing chamber; a source gas supply unit for supplying a source gas containing an organic compound of copper to the processing chamber; an exhaust unit for evacuating the processing chamber; a temperature control unit for maintaining a temperature of the substrate within a range from 100° C. to 150° C.; a controller for controlling the units to perform a step of forming an adhesion layer of copper on the substrate by supplying water vapor and a source gas containing an organic compound of copper to the processing chamber, a step of discharging the water vapor and the source gas out of the processing chamber, a step of forming a copper film on the adhesion layer by supplying the source gas and a smaller amount of water vapor than the water vapor supplied in the step of forming an adhesion layer to the processing chamber.

In accordance with a fifth aspect of the present invention, there is provided a computer-readable storage medium for storing a control program for performing the film forming method by controlling a film forming apparatus which includes: an airtightly sealed processing chamber including a stage for mounting a substrate thereon; a water vapor supply unit for supplying water vapor to the processing chamber; a source gas supply unit for supplying a source gas containing an organic compound of copper to the processing chamber; an exhaust unit for evacuating the processing chamber; and a temperature control unit for maintaining a temperature of the substrate within a range from 100° C. to 150° C.

DETAILED DESCRIPTION OF THE EMBODIMENTS

A semiconductor device manufacturing method using a film forming method of a copper film in accordance with an embodiment of the present invention will be described with reference to FIGS. 1A to 1D. FIGS. 1A to 1D are cross sectional views of a wafer W in a process for manufacturing a semiconductor device formed on a surface portion of the wafer W.

Figure 1A:
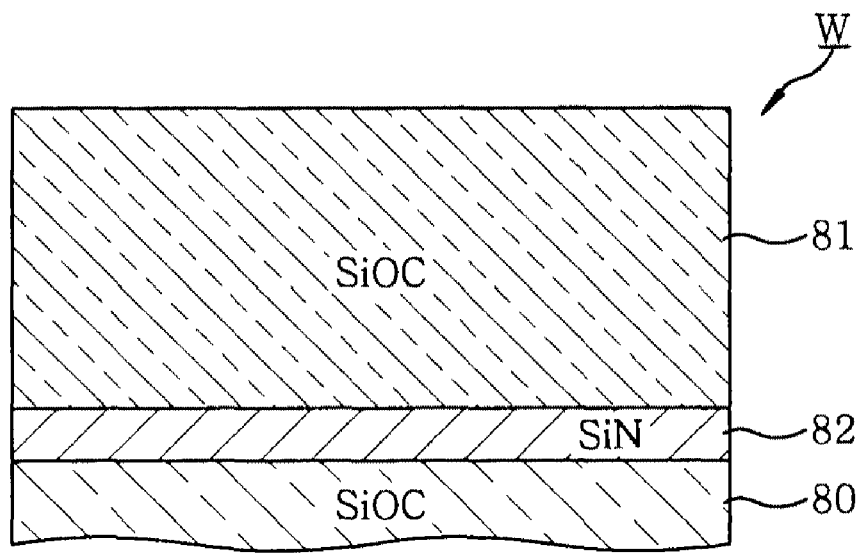
FIGS. 1A to 1D schematically show cross sectional views of a wafer W corresponding to the steps of a semiconductor device manufacturing method using a film forming method of a copper film in accordance with an embodiment of the present invention.

FIG. 1A illustrates a state before a trench is formed in an interlayer insulating film. For simplicity of description, copper is assumed to be buried by employing a single damascene method. In the drawings, reference numerals '80' and '81' designate SiOC films (carbon-containing silicon oxide films) serving as interlayer insulating films, and a reference numeral '82' designates an SiN film (silicon nitride film).

In this case, a method for forming the SiOC films 80 and 81 and the SiN film 82 is explained. These films are formed by, e.g., a plasma film forming process. Specifically, the wafer W is placed in a vacuum chamber evacuated to a vacuum state, and a specific film forming gas is supplied to the vacuum chamber to be converted to a plasma, thereby performing film formation.

Figure 1B:
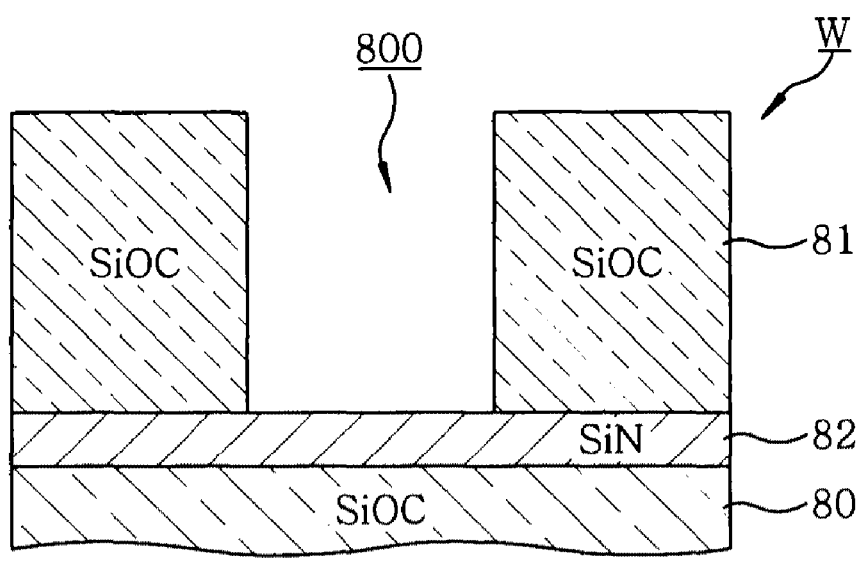

In the wafer W, first, the SiOC film 81 is etched in a specific pattern shape by using, for example, a $CF_4$ gas or $C_4F_8$ gas as an etching gas. In this case, the SiN film 82, which is a base film of the SiOC film 81, serves as an etching stopper. Accordingly, for example, as shown in FIG. 1B, a trench 800 having a line width equal to or smaller than, e.g., 120 nm, preferably, 80 nm, is formed in the SiOC film 81 to bury copper for wiring therein.

Figure 1C:
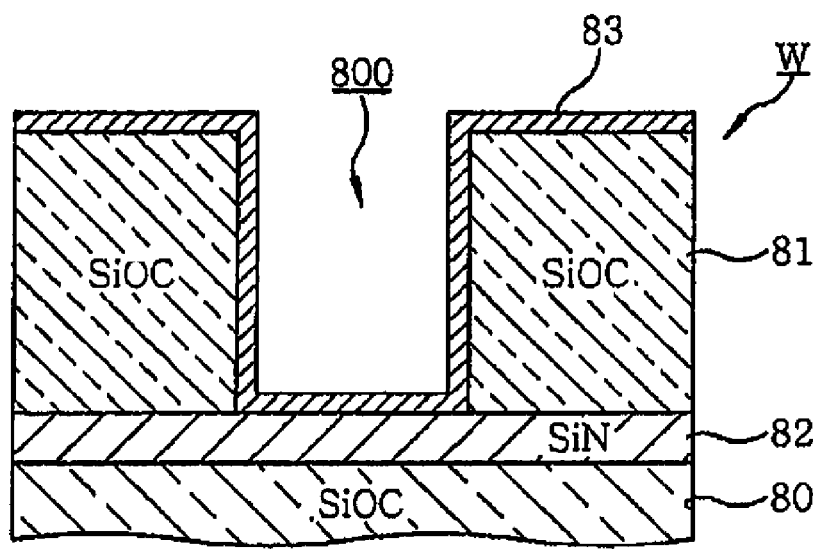
Figure 1D:
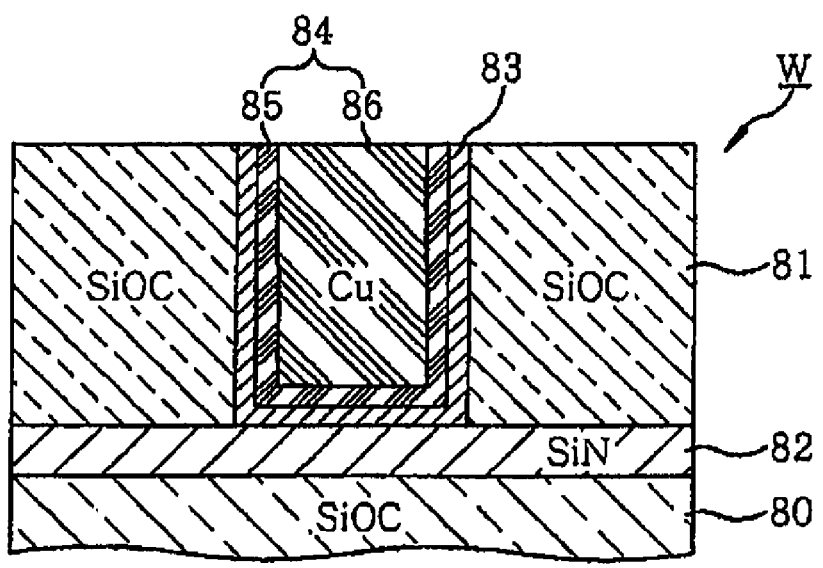

Subsequently, for example, as shown in FIG. 1C, a barrier metal layer (base film) 83 made of, e.g., titanium or tantalum is coated on a surface of the SiOC film 81 including the trench 800. Further, after a copper film 86 is formed such that copper is buried in the trench 800, a chemical mechanical polishing (CMP) process is performed. Consequently, for example, as shown in FIG. 1D, the copper and the barrier metal layer 83 outside the trench 800 are removed, thereby forming a copper line 84 in the trench 800.

Next, a film forming method of a copper film in accordance with the embodiment of the present invention will be described in detail.

In the film forming method, a gas containing an organic compound of copper, such as a Cu(hfac)TMVS gas, is supplied as a source gas to a processing chamber of a CVD apparatus, thereby forming a copper film. In this case, both the Cu(hfac)TMVS gas and water vapor are simultaneously supplied at a specific timing, thereby forming an adhesion layer 85 having less organic impurities.

Then, the supplies of these gases are stopped and residual gases in the processing chamber are evacuated. Accordingly, it is possible to prevent an abnormal growth of the copper film. Then, those gases are resupplied so that the copper film can be formed at a relatively low temperature.

Figure 2:
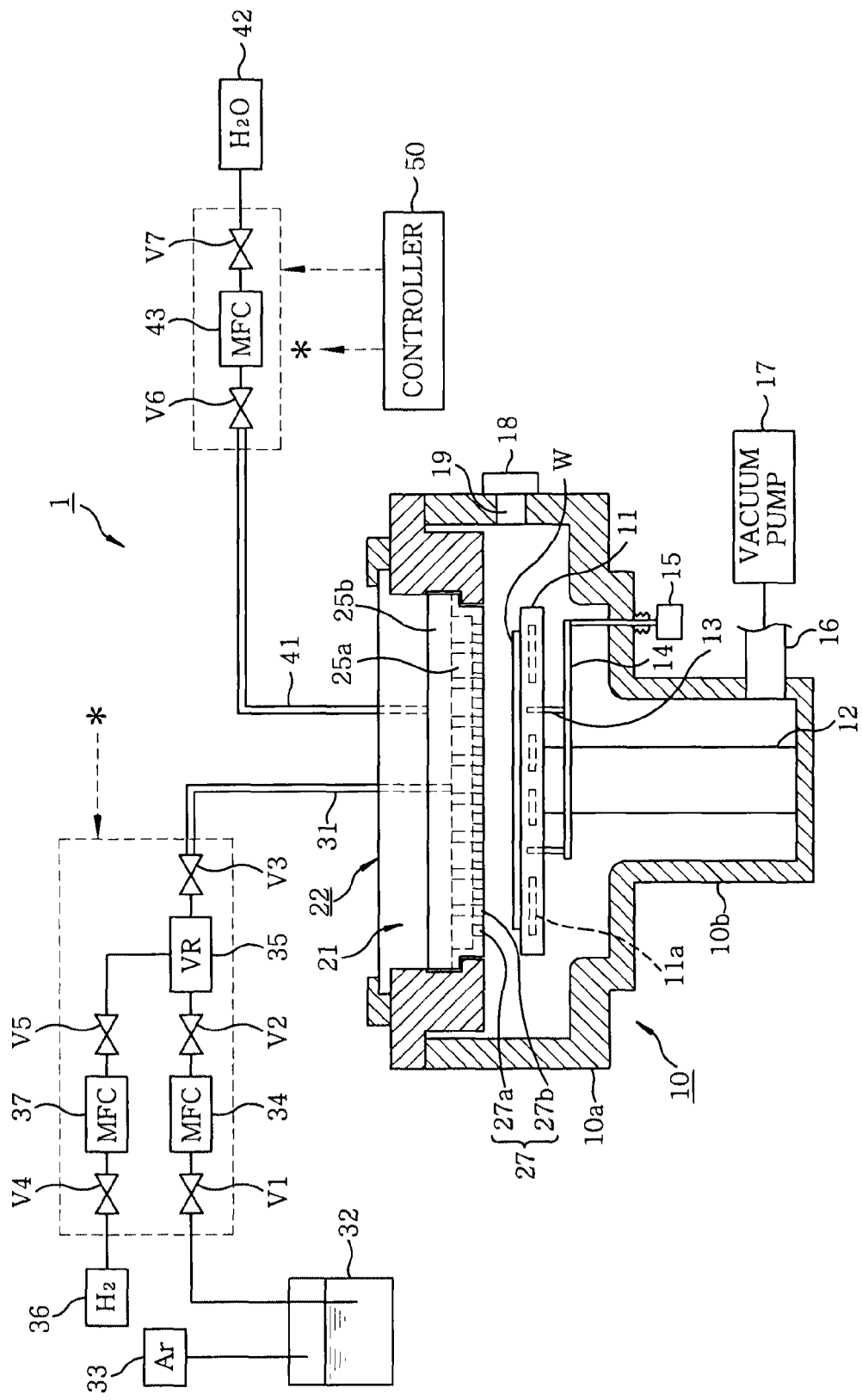
FIG. 2 schematically shows a cross sectional view of a CVD apparatus for forming the film forming method in accordance with the embodiment of the present invention.

Next, an apparatus for performing the film forming method is explained. FIG. 2 illustrates a cross sectional view showing an example of a CVD apparatus for forming the film forming method in accordance with the present invention. The CVD apparatus 1 includes a processing chamber (vacuum chamber) 10 made of, e.g., aluminum. The processing chamber 10 includes an upper large-diameter cylindrical part 10a and a lower small-diameter cylindrical part 10b connected to each other.

A heating unit (not shown) is provided in the processing chamber 10 to heat an inner wall of the processing chamber 10. Further, a stage 11 for horizontally mounting the wafer W thereon is provided in the processing chamber 10. The stage 11 is supported by a support member 12 installed at a bottom portion of the small-diameter cylindrical part 10b.

The stage 11 is provided with a heater 11a serving as a temperature control device of the wafer W. Further, the stage 11 is provided with, for example, three elevating pins 13 capable of vertically moving the wafer W while being protruded from a surface of the stage 11 and retracted into the stage 11, thereby performing a delivery of the wafer W to/from a transfer unit provided outside the processing chamber 10. The elevating pins 13 are connected to an elevating mechanism 15 located outside the processing chamber 10 through a support member 14.

A bottom portion of the processing chamber 10 is connected to one end of an exhaust pipe 16, and a vacuum pump 17 is connected to the other end of the exhaust pipe 16. Further, a transfer port 19 which is opened and closed by using a gate valve 18 is formed at a sidewall of the large-diameter cylindrical part 10a of the processing chamber 10.

An opening 21 is formed at a ceiling portion of the processing chamber 10. A gas shower head 22 is provided to close the opening 21 and face the stage 11. The gas shower head 22 has two gas chambers 25a and 25b and two type gas supply holes 27a and 27b. A gas supplied to the gas chamber 25a is supplied to the processing chamber 10 through the gas supply holes 27a and a gas supplied to the gas chamber 25b is supplied to the processing chamber 10 through the gas supply holes 27b.

A source gas supply line 31 is connected to the lower gas chamber 25a. A source tank 32 is connected to an upstream side of the source gas supply line 31. The source tank 32 contains Cu(hfac)TMVS in a liquid state, which is a copper organic compound (complex) serving as a material (precursor) of a copper film. The source tank 32 is also connected to a compressor 33. An inside of the source tank 32 is compressed by an Ar gas or the like supplied from the compressor 33 such that the Cu(hfac)TMVS is pushed toward the source gas supply line 31.

A liquid mass flow controller (hereinafter, refereed to as "LMFC") 34 and a vaporizer 35 for vaporizing Cu(hfac)TMVS are provided in the source gas supply line 31 sequentially from its upstream side. The vaporizer 35 vaporizes the Cu(hfac)TMVS by contact-mixing it with a carrier gas (hydrogen gas) supplied from a carrier gas supply source 36. In FIG. 2, a reference numeral '37' designates a mass flow controller (MFC) for controlling a flow rate of the carrier gas, reference numerals 'V1' to 'V5' designate valves.

Next, a gas supply system of water vapor is explained. The upper gas chamber 25b is connected to a water vapor supply line 41. A water vapor supply source 42 is connected to an upstream side of the water vapor supply line 41 through an MFC 43. In FIG. 2, reference numerals 'V6' and 'V7' designate valves.

Further, gas supply controllers (represented by dotted lines) provided in a gas supply system of the Cu(hfac)TMVS gas and a gas supply system of water vapor, a pressure controller (not shown) provided in the exhaust pipe 16, the heater 11a, the elevating mechanism 15 and the like are controlled by a controller 50 for controlling an entire operation of the CVD apparatus 1.

The controller 50 includes, for example, a computer having a program storage part (not shown). The program storage part stores a computer program including steps (commands) of an operation or a process (film forming process) for loading/unloading the wafer W to/from the processing chamber 10. Further, the controller 50 controls the entire operation of the CVD apparatus 1 based on a computer program read from the program storage part. Further, the computer program is stored in the program storage part by being stored in a storage unit such as a hard disk, a compact disk, a magneto-optical disk, a memory card or the like.

Figure 3:
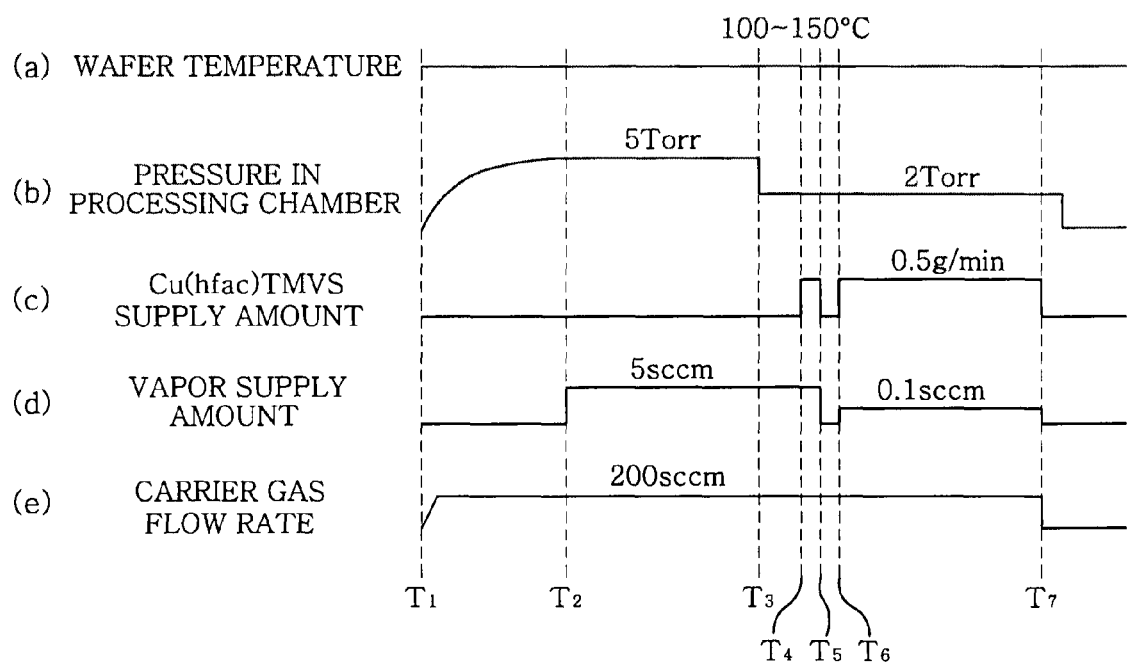
FIG. 3 illustrates an example of a process sequence for performing the film forming method in accordance with the embodiment of the present invention.

FIG. 3 illustrates an example of a process sequence for performing the film forming method in accordance with the embodiment of the present invention. In FIG. 3, (a) represents a time sequence of a temperature of the wafer W on which a film forming process is performed, wherein a solid line represents a temperature (° C.) of the wafer W. Further, (b) of FIG. 3 represents a time sequence of a pressure in the processing chamber 10, wherein a solid line represents an absolute pressure in the processing chamber 10, and (c) of FIG. 3 represents a time sequence of a gas supply amount of Cu(hfac)TMVS, wherein a solid line represents a supply amount (g/min; mass conversion) of Cu(hfac)TMVS. Further, (d) of FIG. 3 represents a time sequence of a water vapor supply amount, wherein a solid line represents a flow rate (sccm) of water vapor, and (e) of FIG. 3 represents a time sequence of a flow rate of a carrier gas (hydrogen) for carrying the Cu(hfac)TMVS gas, wherein a solid line represents a flow rate (sccm) of the carrier gas.

In accordance with the process sequence of FIG. 3, the wafer W having a surface state shown in FIG. 1C, in which the barrier metal layer 83 is formed on the SiOC film 81, is placed in the processing chamber 10 and the processing chamber 10 is controlled to have a pressure of, e.g., about 133 Pa (1 Torr). At a time T1, a carrier gas is supplied at a flow rate of, e.g., 200 sccm, and the pressure in the processing chamber 10 rises to, e.g., 5 Torr. Further, at a time T2 before the supply of the Cu(hfac)TMVS gas is started, the water vapor is supplied at a flow rate of, e.g., 5 sccm.

Then, at a time T3, the pressure in the processing chamber 10 is adjusted to 2 Torr by the pressure controller (not shown). After that, while the water vapor is continuously supplied, at a time T4, the Cu(hfac)TMVS gas begins to be supplied at, e.g., 0.5 g/min to thereby form an adhesion layer of copper on the surface of the barrier metal layer 83. Further, after, e.g., 5 to 60 seconds, particularly, 30 seconds, at a time T5, the supplies of the Cu(hfac)TMVS gas and the water vapor are stopped.

In the mean time, the supply of the carrier gas and the vacuum evacuation by using the vacuum pump are continuously performed. Accordingly, residual Cu(hfac)TMVS gas and water vapor are discharged out of the processing chamber 10.

Then, at a time T6 after residual gases in the processing chamber 10 are sufficiently discharged, the Cu(hfac)TMVS gas begins to be resupplied. At this time, the water vapor also begins to be resupplied at a small amount, for example, 0.1 sccm or less, which is sufficiently small enough to reduce a process temperature (wafer temperature) of CVD while hardly causing an abnormal growth of the copper film. Further, at a time T7 when the copper film is formed to have a desired thickness, the supplies of the Cu(hfac)TMVS gas and the water vapor are stopped, thereby completing the process sequence.

As the CVD apparatus 1 is operated based on the above-mentioned process sequence, the copper film of a desired thickness can be formed on the wafer W having the trench 800 formed therein and the barrier metal layer 83 coated thereon, as described with reference to FIGS. 1A to 1D.

In the sequence shown in FIG. 3, in the process after the time T4 when the Cu(hfac)TMVS gas begins to be supplied to the processing chamber 10 which has been supplied with the water vapor, a reaction for forming the adhesion layer of copper on the barrier metal layer 83 shown in FIG. 1C is performed. Since the supply of the water vapor is started in the processing chamber 10 from the time T2 before starting the supply of the Cu(hfac)TMVS gas, water molecules are sufficiently adsorbed to the surface of the wafer W. Accordingly, the reaction for forming the adhesion layer can be easily performed while suppressing formation of the organic impurity layer.

Then, after the supplies of the water vapor and the Cu(hfac)TMVS gas are stopped, the residual gases are discharged out of the processing chamber 10. Accordingly, formation of the adhesion layer is stopped, and an abnormal growth of copper is suppressed to a minimum. First of all, since water vapor exists in the process for forming the adhesion layer, there is a possibility of causing an abnormal growth of copper. However, the Cu(hfac)TMVS gas is supplied for a very short period of time to the processing chamber 10 containing the water vapor, and the processing chamber 10 is evacuated right thereafter, thereby immediately stopping the abnormal growth. Thus, there is no chance that the copper film is grown in a needle shape, and it is considered that the water vapor has almost no influence on adhesiveness between the barrier metal layer 83 and the adhesion layer.

Then, after the time T6 after the evacuation is completed, the Cu(hfac)TMVS gas begins to be resupplied to the processing chamber 10 such that the copper film is grown on the surface of the adhesion layer.

Further, a small amount of water vapor, small enough not to cause an abnormal growth of the copper film, is supplied in a period from the time T6 to the time T7 in the process sequence shown in FIG. 3. Accordingly, the copper film can be grown at a low process temperature (wafer temperature) ranging from 100° C. to 150° C., for example, 130° C. because water molecules serve as catalyzers.

In accordance with the above-described embodiment of the present invention, following effects can be obtained. That is, since the adhesion layer is formed under an atmosphere containing water vapor, although the barrier metal layer (base film) 83 on which the adhesion layer is formed is made of metal such as titanium having a high oxidation tendency, it is possible to prevent formation of the organic impurity layer and improve adhesiveness between the base film and the adhesion layer. Further, the processing chamber 10 is evacuated after formation of the adhesion layer and, then, the Cu(hfac)TMVS gas is resupplied to form the copper film, thereby suppressing an abnormal growth of the copper film due to the water vapor. Further, since the steps are continuously performed, it is possible to suppress a demerit (abnormal growth) due to the supply of water vapor to a minimum while maintaining a merit (prevention of formation of the organic impurity layer) due to the supply of water vapor. As a result, it is possible to form the copper film having excellent adhesiveness on the barrier metal layer 83. Thus, it is possible to prevent troubles such as peel-off of the copper line 84 in processing of the semiconductor device, thereby improving a production yield in the manufacture of semiconductor devices.

Further, since the water vapor is supplied to the processing chamber 10 in formation of the adhesion layer, a process temperature (wafer temperature) for forming the copper film can be reduced to a temperature ranging, for example, from 100° C. to 150° C. As a result, it is possible to improve morphology of the surface of the copper film and a void is hardly formed in the copper line 84, thereby improving a production yield. Further, since the process temperature is reduced, it is possible to promote energy saving.

Also in the process for forming the copper film on the surface of the adhesion layer, a very small amount of water vapor, for example, 0.001 sccm to 0.1 sccm (less than an amount of water vapor supplied between the time T2 and the time T5), is supplied so that it hardly causes an abnormal growth of the copper film. Accordingly, the process temperature can range from 100° C. to 150° C. Also in this process, it is possible to improve morphology and promote energy saving.

Figure 4A:
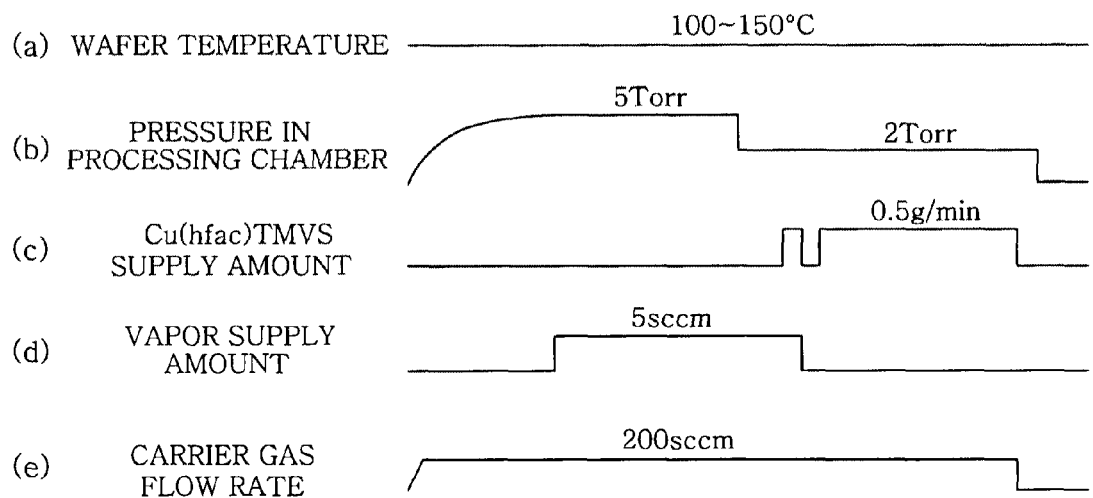
FIGS. 4A and 4B show a modification example of the process sequence of FIG. 3.
Figure 4B:
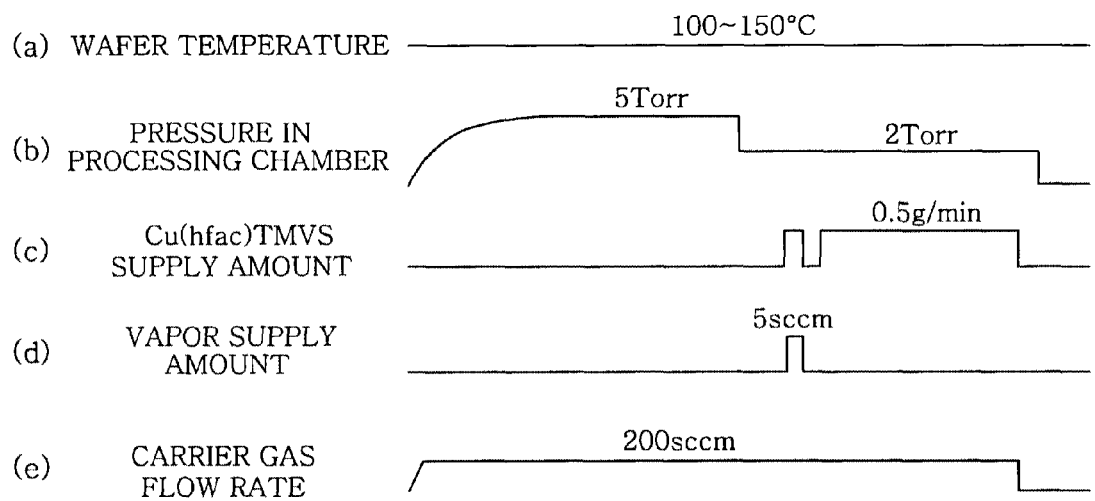

Further, the process sequence of the film forming method in accordance with the present invention is not limited to that shown in FIG. 3. For instance, as shown in FIG. 4A, the supply of water vapor for reducing the process temperature may not be performed while the copper film is formed on the surface of the adhesion layer. Further, as shown in FIG. 4B, the water vapor may be supplied for a short period of time at the same timing as the supply of the Cu(hfac)TMVS gas without performing the supply of water vapor in advance.

Although both the Cu(hfac)TMVS gas and the water vapor are supplied to the processing chamber 10 while the adhesion layer is formed in the above embodiment, it is not limited thereto. For example, after the water vapor is supplied in advance and the supply of water vapor is stopped, only the Cu(hfac)TMVS gas may be resumed to be supplied to the processing chamber 10 to form the adhesion layer. In this case, the vacuum pump 17 may be temporarily stopped until the supply of the Cu(hfac)TMVS gas is stopped to prevent the water vapor from being discharged.

Further, the barrier metal layer (base film) 83 on which the adhesion layer is formed may be made of tantalum instead of titanium. The barrier metal layer may be formed of a compound obtained by combining titanium or tantalum with one or two elements among nitrogen, carbon and oxygen. Moreover, the barrier metal layer may be formed of ruthenium or oxide thereof.

EXAMPLES

Experiment 1

In accordance with the film forming method of the embodiment of the present invention, an adhesion layer and a copper film were formed on a base film made of titanium. Then, cross sections of the films were observed.

Example 1-1

Figure 5A:
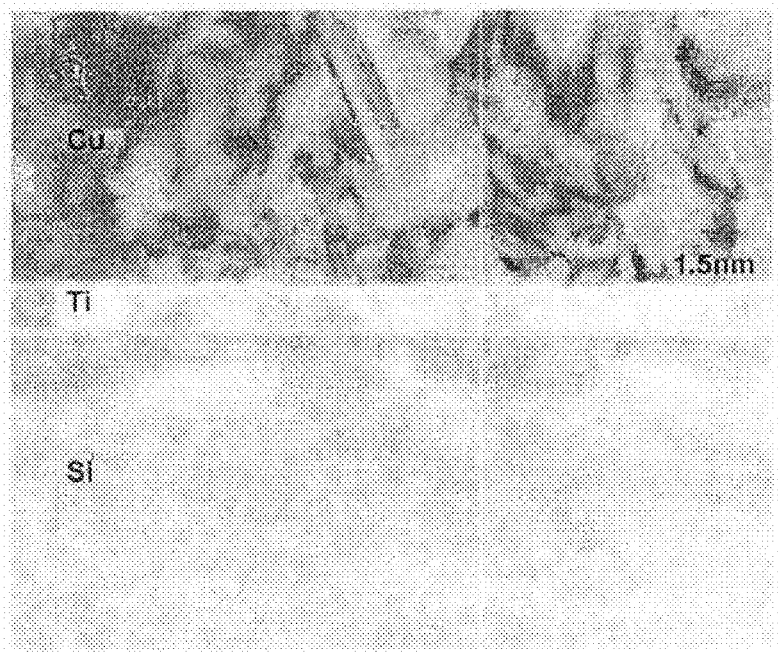
FIGS. 5A and 5B are enlarged photographs of a cross section of the wafer to evaluate a formation state of an organic impurity layer.

The copper film was formed on the surface of a barrier metal of titanium coated on the wafer W in accordance with the process sequence shown in FIG. 3. Further, the process temperature was maintained at 130° C. and the supply of water vapor was stopped during the period of time between the time T6 and the time T7. The cross sections of the obtained copper film and the base film were photographed by SEM and the result thereof is shown in FIG. 5A.

Comparison Example 1-1

In the same way, a copper film was formed on the surface of the barrier metal of titanium in accordance with a process sequence obtained by partially varying the process sequence shown in FIG. 3. In the process sequence of Comparison example 1-1, the supply of water vapor was not performed in a period between the time T1 and the time T7.

Figure 5B:
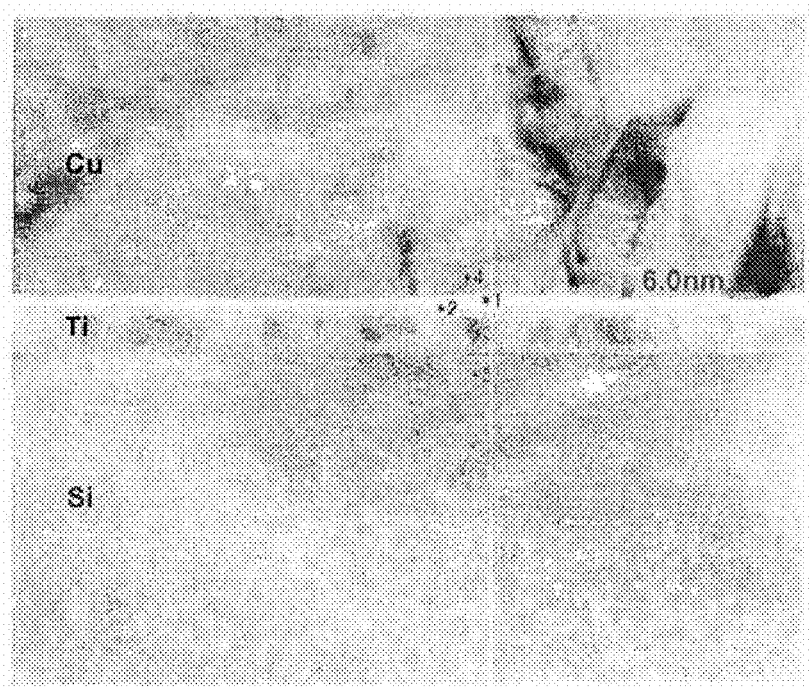

This fact is different from Example 1-1. Further, the process temperature was maintained at 130° C. The cross sections of the obtained copper film and the base film were photographed by SEM and the result thereof is shown in FIG. 5B.

(Consideration of Experiment 1)

As shown in FIG. 5A, in Example 1-1 of forming the copper film with the supply of water vapor, an organic impurity layer was formed to have a thickness of 1.5 nm and, namely, the organic impurity layer was hardly formed. On the other hand, in Comparison example 1-1 performed without the supply of water vapor, as shown in FIG. 5B, an organic impurity layer was formed to have a thickness of 6 nm, which is four times that in the case performed with the supply of water vapor. The formation of the thick organic impurity layer is considered to deteriorate adhesiveness between the base film and the copper film.

Experiment 2

In accordance with the film forming method of the embodiment of the present invention, a copper film was formed. Then, the surface of the film was observed.

Example 2-1

Figure 6A:
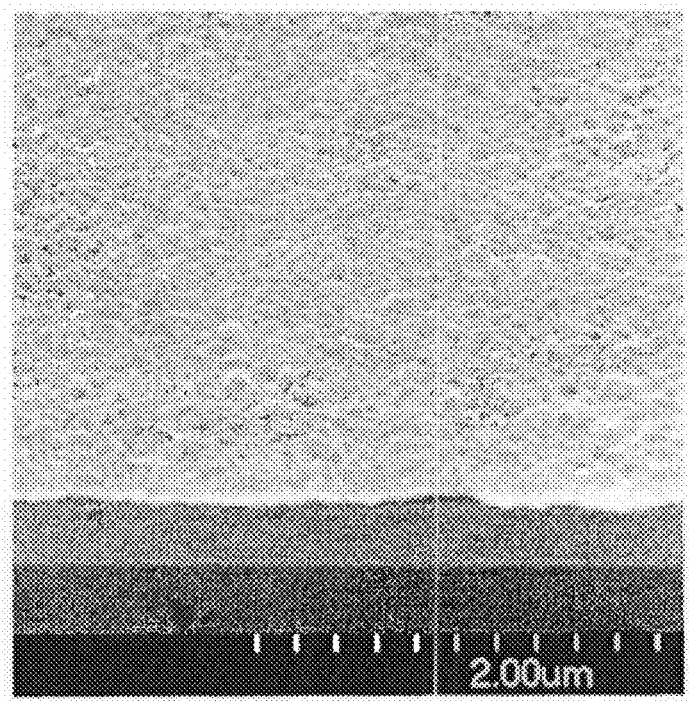
FIGS. 6A and 6B are enlarged photographs for evaluating morphology of the surface of the copper film.

The copper film was formed under the same conditions as those of Example 1-1. Then, the surface of the copper film was photographed by SEM and the result thereof is shown in FIG. 6A.

Comparison Example 2-1

Figure 6B:
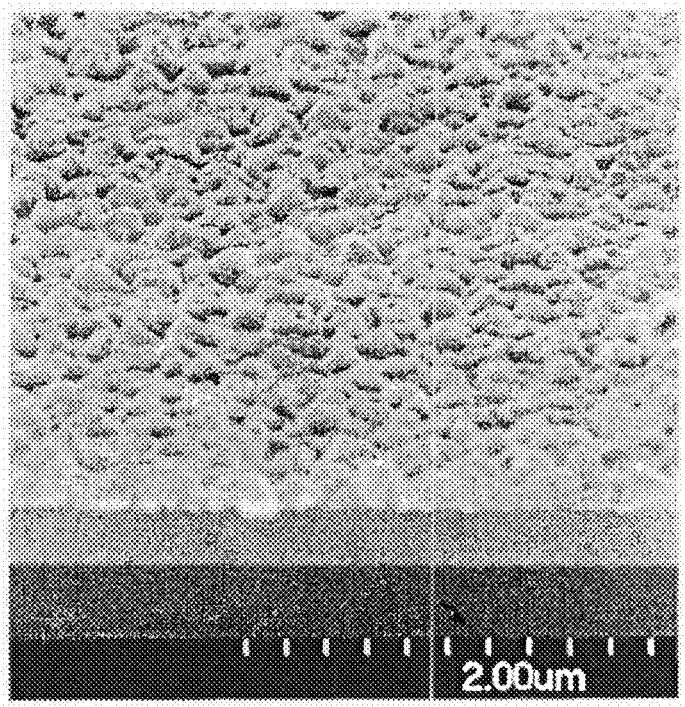

The copper film was formed under the same conditions as those of Comparison example 1-1. Then, the surface of the copper film was photographed by SEM and the result thereof is shown in FIG. 6B.

(Consideration of Experiment 2)

From the result of Example 2-1, as shown in FIG. 6A, it can be seen that small prominences and depressions are formed on the surface of the copper film and the copper film has good morphology. On the other hand, from the result of Comparison example 2-1 without the supply of water vapor to the processing chamber 10, as shown in FIG. 6B, it can be seen that large prominences and depressions are formed on the surface of the copper film and the copper film has poor morphology. From the results, it can be seen that it is possible to improve morphology of the surface of the copper film by reducing the process temperature with the supply of water vapor in CVD using the Cu(hfac)TMVS gas as a material.

Experiment 3

The copper film was formed on the wafer W having a trench on its surface in accordance of the film forming method of the present invention, and buriability of copper in the trench was investigated.

Example 3-1

Figure 7A:
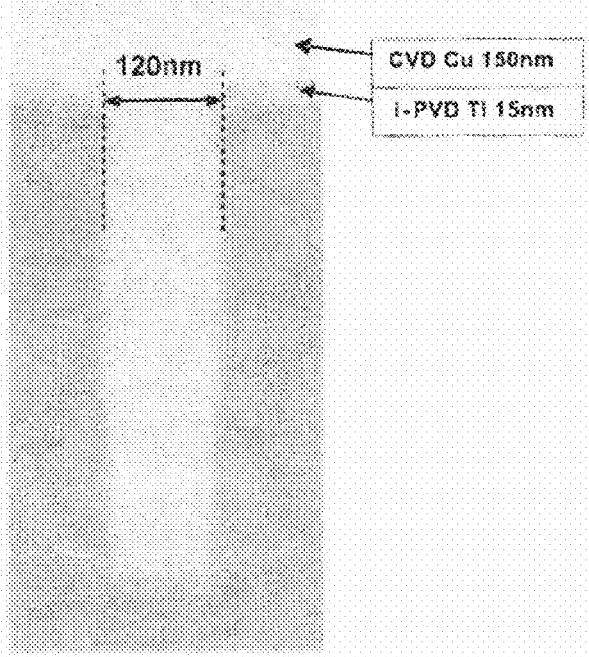
FIGS. 7A and 7B are enlarged photographs of a cross section of the wafer to evaluate buriability of copper in a trench formed on the surface of the wafer.

The copper film was formed in accordance with the process sequence shown in FIG. 3, and copper was buried in the trench having a width of 120 nm and a depth of 500 nm (aspect ratio of 4.2). The base film of titanium was formed on the surface of the trench in advance to have a thickness of 15 nm by ionized PVD. Then, the cross section of the trench was photographed by SEM and the result thereof is shown in FIG. 7A.

Example 3-2

The copper film was formed in the same way, and copper was buried in the trench having a width of 80 nm and a depth of 500 nm (aspect ratio of 6.3). The base film of titanium was formed on the surface of the trench in the same way as in Example 3-1. Then, the cross section of the trench was photographed by SEM and the result thereof is shown in FIG. 7B.

(Consideration of Experiment 3)

Figure 7B:
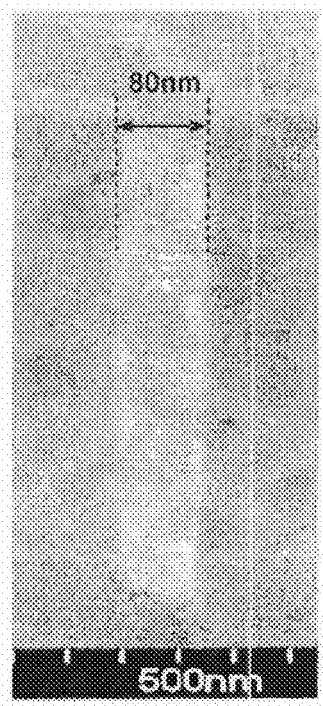

As shown in FIGS. 7A and 7B, in both Examples 3-1 and 3-2, since the organic impurity layer was hardly formed and the wettability of the surface of the trench was not reduced, the buriability of copper in the trench was good.

What is claimed is:

1. A film forming method comprising:
   a substrate placing step of placing a substrate in an airtightly sealed processing chamber;
   a first film forming step of forming an adhesion layer of copper on the substrate by supplying water vapor and a source gas containing an organic compound of copper to the processing chamber;
   a discharging step of discharging the water vapor and the source gas out of the processing chamber; and
   a second film forming step of forming a copper film on the adhesion layer by resupplying only the source gas to the processing chamber,
   wherein in the first film forming step, the supply of the source gas starts in a delayed manner after starting the supply of the water vapor, and
   wherein in the first film forming step, the supply of the source gas starts after stopping the supply of the water vapor.

2. A film forming method comprising:
   a substrate placing step of placing a substrate in an airtightly sealed processing chamber;
   a first film forming step of forming an adhesion layer of copper on the substrate by supplying water vapor and a source gas containing an organic compound of copper to the processing chamber;
   a discharging step of discharging the water vapor and the source gas out of the processing chamber; and
   a second film forming step of forming a copper film on the adhesion layer by resupplying the source gas and the water vapor to the processing chamber,
   wherein an amount of the water vapor supplied in the second film forming step is smaller than an amount of the water vapor supplied in the first film forming step, wherein in the first film forming step, the supply of the source gas starts in a delayed manner after starting the supply of the water vapor, and wherein in the first film forming step, the supply of the source gas starts after stopping the supply of the water vapor.

3. The film forming method of claim 1, wherein the substrate is heated to a temperature within a range from 100° C. to 150° C.

4. The film forming method of claim 2, wherein the substrate is heated to a temperature within a range from 100° C. to 150° C.

5. The film forming method of claim 1, wherein a base film made of metal selected from titanium and tantalum, a base film made of a compound obtained by combining the metal with one or two elements among nitrogen, carbon and oxygen, or a base film made of ruthenium or oxide thereof is formed in advance on the substrate, and the copper film is formed on the base film.

6. The film forming method of claim 2, wherein a base film made of metal selected from titanium and tantalum, a base film made of a compound obtained by combining the metal with one or two elements among nitrogen, carbon and oxygen, or a base film made of ruthenium or oxide thereof is formed in advance on the substrate, and the copper film is formed on the base film.

* * * * *